United States Patent
Landsberger et al.

(10) Patent No.: US 8,677,818 B2
(45) Date of Patent: Mar. 25, 2014

(54) FLOW SENSING DEVICE AND PACKAGING THEREOF

(75) Inventors: Leslie M. Landsberger, Montreal (CA); Oleg Grudin, Montreal (CA); Salman Saed, Montreal (CA); Gennadiy Frolov, Montreal (CA)

(73) Assignee: Sensortechnics GmbH, Puchheim (DE)

( * ) Notice: Subject to any disclaimer, the term of this patent is extended or adjusted under 35 U.S.C. 154(b) by 174 days.

(21) Appl. No.: 13/255,579

(22) PCT Filed: Mar. 10, 2010
(Under 37 CFR 1.47)

(86) PCT No.: PCT/CA2010/000354
§ 371 (c)(1),
(2), (4) Date: Dec. 13, 2011

(87) PCT Pub. No.: WO2010/102403
PCT Pub. Date: Sep. 16, 2010

(65) Prior Publication Data
US 2012/0161256 A1    Jun. 28, 2012

Related U.S. Application Data

(60) Provisional application No. 61/158,987, filed on Mar. 10, 2009.

(51) Int. Cl.
*G01F 1/68* (2006.01)
(52) U.S. Cl.
USPC ............................................. 73/204.11

(58) Field of Classification Search
USPC ................ 73/861.11, 204.22, 204.12, 204.13
See application file for complete search history.

(56) References Cited

U.S. PATENT DOCUMENTS

| | | | |
|---|---|---|---|
| 4,548,078 A | 10/1985 | Bohrer et al. | |
| 5,404,753 A * | 4/1995 | Hecht et al. | 73/204.22 |
| 6,263,741 B1 | 7/2001 | Woias | |
| 6,591,674 B2 | 7/2003 | Gehman et al. | |
| 6,911,894 B2 * | 6/2005 | Bonne et al. | 338/25 |
| 6,920,786 B2 * | 7/2005 | Mayer et al. | 73/204.22 |
| 7,703,339 B2 | 4/2010 | Sulouff, Jr. et al. | |
| 7,757,553 B2 * | 7/2010 | Meier et al. | 73/204.22 |
| 7,793,410 B2 * | 9/2010 | Padmanabhan et al. | 29/832 |
| 2009/0158838 A1 | 6/2009 | Speldrich | |

FOREIGN PATENT DOCUMENTS

| | | |
|---|---|---|
| EP | 1365216 | 11/2003 |
| WO | 2005086883 | 9/2005 |

OTHER PUBLICATIONS

International Search Report dated Jun. 9, 2010 issued by the International Bureau (WIPO) in connection with the corresponding International patent application No. PCT/CA2010/000354.

(Continued)

*Primary Examiner* — Jewel V Thompson
(74) *Attorney, Agent, or Firm* — Norton Rose Fulbright Canada LLP

(57) ABSTRACT

There is described a flow sensing device having a semiconductor chip with a flow channel integrated therein and a sensing element positioned in the flow channel, and a package base attached to the semiconductor chip and allowing access to the two passage-openings of the flow channel from opposite sides of the package base.

22 Claims, 5 Drawing Sheets

(56) References Cited

OTHER PUBLICATIONS

Mastrangelo et al., "A Constant-Temperature Gas Flowmeter with a Silicon Micromachined Package", IEEE Solid-State Sensor and Actuator Workshop, Tech. Digest 43-6, Hilton Head Island, SC, Jun. 1988.

Dijkstra et al., "Nano-Flow Thermal Sensor Applying Dynamic ω2ω Sensing Method", Proceedings of 17th Workshop on Micromachining, Micromechanics and Microsystems, Sep. 2006.

* cited by examiner

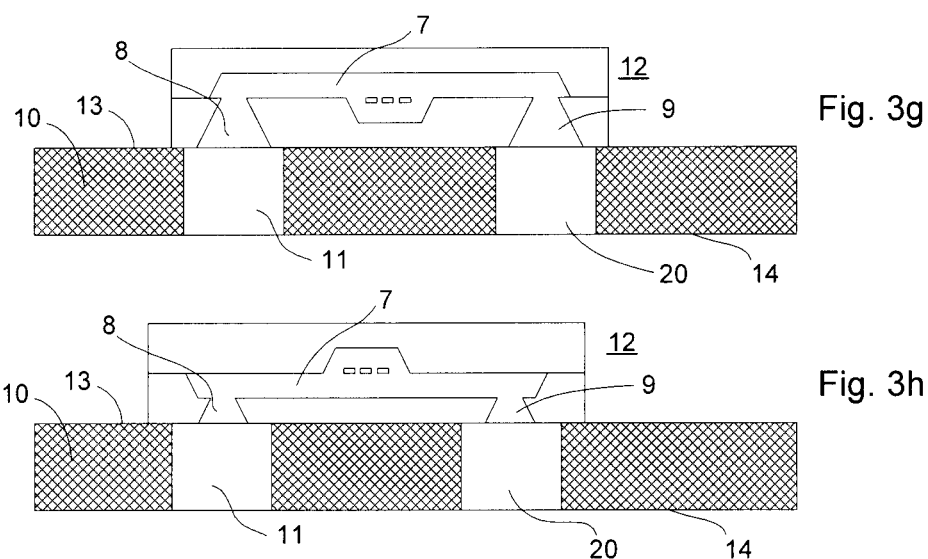

FLOW SENSING DEVICE AND PACKAGING THEREOF

CROSS-REFERENCE TO RELATED APPLICATIONS

This application claims priority under 35 USC 119(e) of U.S. Provisional Patent Application bearing Ser. No. 61/158,987 filed on Mar. 10, 2009, the contents of which are hereby incorporated by reference.

TECHNICAL FIELD

The present invention relates to the field of flow sensor devices, and more particularly, to the packaging and forming of the flow channel in a flow sensor device.

BACKGROUND

Thermoanemometer-type thermal sensors have been commonly used to measure flow and differential pressure in gases and liquids. Typically the sensing element of the sensor contains a central heater and two temperature-sensitive entities positioned symmetrically on both sides of the heater. Gas or liquid (fluid) flow passing over the sensing element disturbs the temperature distribution in the fluid in the vicinity of the heater, causing a temperature difference between two temperature-sensitive entities, which is further converted into an electrical signal.

Some packaging solutions for flow sensors include a specially-designed flow channel within which the sensing element is positioned, such that the fluid flow passes over the sensing element or surrounds the sensing element as it passes. Typically the flow channel maintains laminar flow which is directly proportional to the pressure difference between the two ports (ends) of the flow channel. Therefore these devices may be considered as differential pressure sensors and/or flow sensors.

One prior art sensor design comprises a package cover with two ports and a groove in its surface. After this cover is attached to the base of the package, with the sensor chip mounted to the base, the flow channel is formed by the groove together with the surface of the sensor chip. With the sensor chip mounted to the base of the package, the flow channel is defined by this groove together with the surface of the sensor chip. The sensor chip is aligned such that the fluid in the channel flows over or surrounding the sensing element, causing the output signal.

Another sensor design comprises the cover of the package with two pre-molded cavities to form the gas flow channel and provide means to cover/protect bonding wires.

A common feature of these above two sensor packaging schemes, and other analogous sensor packaging schemes, is the formation of the flow channel at the stage of package assembly, by mating the individual sensor chip with package components. Typically, an individual flow channel is mated to the sensor chip after the sensor chip has been mounted on or in the package base. Variations in the sensor performance may come from possible misalignment of the sensor chip to the package components, and from unit-to-unit variability of the dimensions of the flow channel, both sources influenced by the manufacturing process of the packaging components and by the unit-by-unit sensor-assembly operation.

Therefore, there is a need to reduce the impact of the packaging process on the creation of flow sensor devices to minimize variations in performance of individual devices.

SUMMARY

There is described herein a flow sensor with a simple and cost-effective packaging process, to provide high pneumatic impedance of the sensor. The flow sensor described herein may reduce the influence of the packaging process, as well as the influence of misalignment of package components on the performance of the sensor.

In accordance with a broad aspect, there is provided a flow sensing device comprising a semiconductor chip having a chip base and a chip cap and a flow channel integrated therein, the flow channel formed between the chip base and the chip cap, and a sensing element positioned in the flow channel, the semiconductor chip having a first passage-opening in the chip base in fluid communication with the flow channel, and a second passage-opening in one of the chip base, the chip cap, and a space between the chip base and the chip cap in fluid communication with the flow channel.

In one embodiment, the flow sensing device also comprises a package base, having a top surface on a top side and a bottom surface on a bottom side, attached to the chip base of the semiconductor chip at the top surface, the package base having a first aperture in fluid communication with the first passage-opening, the first aperture extending through the package base from the top surface to the bottom surface, the first passage-opening being accessible from the bottom side of the package base and the second passage-opening of the semiconductor chip being accessible from the top side of the package base.

Having the access to both ends of the flow channel realized from opposite sides of the package base simplifies the final packaging process. One embodiment of the package includes two covers with pressure/flow ports attached to opposite sides of the package base. Another embodiment comprises a first packaging cover attached to the package base at the top surface and forming a cavity therewith for housing the semiconductor chip, the second passage-opening being in fluid communication with the cavity and a second aperture provided on one of the first packaging cover and the package base.

In another embodiment, the package base comprises a second aperture and two pressure/flow ports are attached to the bottom side of the package base. In this case, the chip and the second aperture are in the cavity formed by the cover attached to the package base.

The performance of the flow sensing device is determined mainly by the properties of the sensing element and the geometry of the flow channel inside the semiconductor chip. Contemporary methods of silicon wafer processing provide accurate control of dimensions of the flow channel in the range from micrometers to hundreds of micrometers. Wafer bonding techniques also allow accurate alignment of two wafers, which provides micro-flow channels with highly reproducible characteristics and high pneumatic impedance.

In one embodiment, the semiconductor chip cap may be attached individually or by a wafer-scale capping, such as a glass frit bonding or another wafer-scale capping method.

In accordance with another broad aspect, there is provided a flow sensing device comprising: a semiconductor chip having a chip base and a chip cap and a flow channel integrated therein, the flow channel formed between the chip base and the chip cap of the semiconductor chip, and a sensing element positioned in the flow channel, the semiconductor chip having a first passage-opening in the chip cap in fluid communication with the flow channel, and a second passage-opening in one of the chip cap and a space between the chip base and the chip cap in fluid communication with the flow channel; a package base, having a top surface on a top side and a bottom surface on a bottom side, attached to the chip cap of the semiconductor chip at the top surface, the package base having a first aperture in fluid communication with the first passage-opening, the first aperture extending through the package base from the top surface to the bottom surface, the first passage-opening being accessible from the bottom side of the package base and the second passage-opening of the semiconductor chip being accessible from the top side of the package base.

For the purposes of the present description, the chip has a front side and a back side. The package base has a top side including a top surface, and a bottom side including a bottom surface. The chip's back side is attached to the top surface of the package base. The flow-channel in the chip is accessed through two passage-openings, one on the bottom side of the package base (directly at the bottom surface of the package base), and one on the top side of the package base, which may be at the top side of the chip (e.g. FIG. 3a), or at the side of the chip (e.g. FIG. 3c), or at the top surface of the package base (e.g. FIG. 3b).

The expression "a space between the chip cap and the chip base" to form a passage-opening should be understood as being formed by one of the following: a groove provided in the chip cap, a groove provided in the chip base, and a combination of a groove in the chip cap and a groove in the chip base that together form the passage-opening.

BRIEF DESCRIPTION OF THE DRAWINGS

Further features and advantages of the present invention will become apparent from the following detailed description, taken in combination with the appended drawings, in which:

FIG. 3g shows the semiconductor chip of FIG. 2b attached to a package base by the chip base, the package base having two apertures therethrough, in accordance with one embodiment;

FIG. 3h shows the semiconductor chip of FIG. 2d attached to a package base by the chip cap, the package base having two apertures therethrough, in accordance with one embodiment;

It will be noted that throughout the appended drawings, like features are identified by like reference numerals. In addition, it will be understood that the embodiments illustrated in the attached drawings are not to scale.

DETAILED DESCRIPTION

The basic principle of a thermo-anemometer-type flow sensor is that a heating element heats the gas volume immediately surrounding it. If the gas volume is not moving to the left or right, then a pair of heat-sensing resistors positioned symmetrically to each side of the heating element will sense equal temperature. If the gas volume is moving to the left or right, as would be caused by a gas flow, then the temperatures sensed at the two heat-sensing resistors will not be equal and the gas flow rate can be derived.

The gas flow rate across the sensing element is itself dependent on the characteristics of the flow channel, including length, width, cross-sectional shape, layout shape, etc. These characteristics affect the flow impedance of gas through the flow channel as a whole (as experienced from the two inlets to the flow channel), and affect the flow velocity of gas across the sensing elements.

When miniaturized so that the flow impedance is very high, such sensors ("micro-flow" sensors), can also be used as differential pressure sensors sensing very low differential pressures. By sensing flow between the two input ports of the flow channel, and knowing the flow-impedance of the flow channel, the sensed information can be translated into information about the difference between the two levels of pressure at the two input ports.

Figure 1:
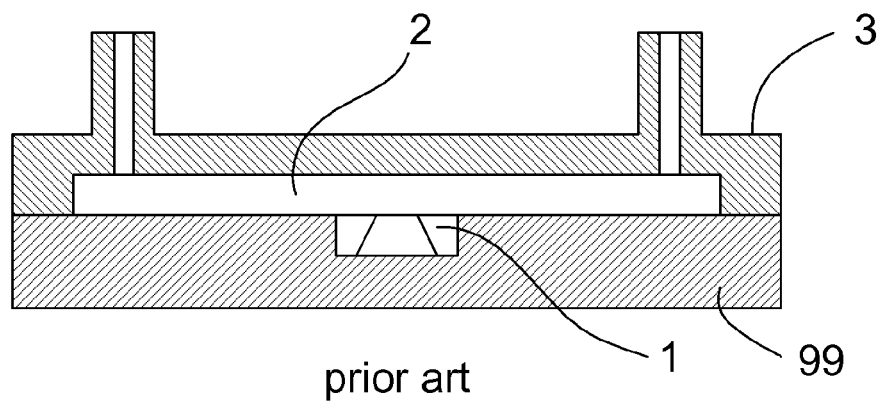
FIG. 1 shows a cross-sectional view of a packaged flow sensor, with a semiconductor chip attached to a package base and forming a flow channel with a package cover, as per the prior art.

Narrow flow channels may be implemented in the packaging of the sensor die. The sensing elements may be made in a silicon chip, but typically the flow channel is implemented in/by the packaging. This involves fine control over the dimensions of the packaging, and fine alignment between the packaging and the sensing chip. A conventional packaged flow sensing device from the prior art is shown in FIG. 1. A semiconductor chip 1 is attached to the base of the package 99. Flow channel 2 is formed between the package cover 3 (having two pressure/flow ports), and the package base 99.

Figure 2A:
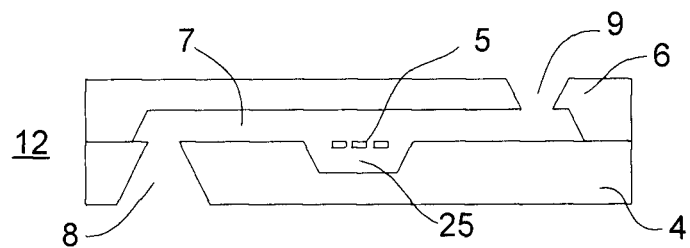
FIG. 2a shows a schematic cross-sectional view of the semiconductor chip with an integrated flow channel, with one passage-opening on a chip base and one passage-opening on a chip cap, in accordance with one embodiment.
Figure 2B:
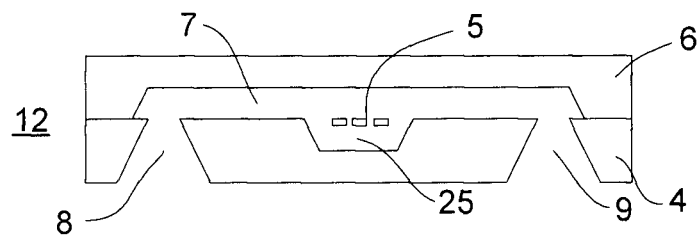
FIG. 2b shows a schematic cross-sectional view of the semiconductor chip with an integrated flow channel, with both passage-openings on a chip base, in accordance with one embodiment.
Figure 2C:
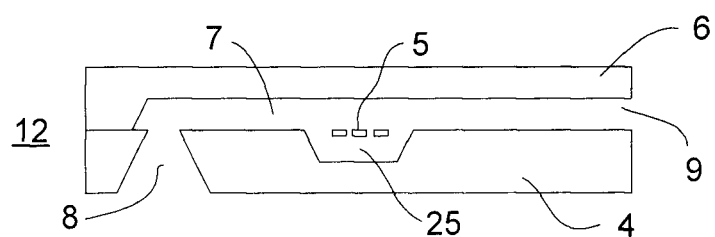
FIG. 2c shows a schematic cross-sectional view of the semiconductor chip with an integrated flow channel, with one passage-opening on a chip base and one passage-opening between the chip base and the chip cap, in accordance with one embodiment.

FIGS. 2a, 2b, and 2c illustrate a semiconductor chip 12 with an integrated flow channel 7, the chip consisting of two main parts: a chip base 4 and a chip cap 6 attached together. Thermal flow sensing element 5 is formed over a cavity in chip base 4. In one embodiment, the flow sensing element 5 contains a central heater and two temperature-sensitive entities positioned on both sides of the heater. The temperature-sensitive entities can be, for example, thermo-resistors or thermo-couples. Flow channel 7 is formed between the top surface of the chip base 4 and the bottom surface of the chip cap 6. The geometry of the flow channel 7 is determined by the shapes of the groove formed on the bottom surface of the chip cap 6 and cavities formed on a top surface of the chip base 4. FIGS. 2a, 2b, 2c show only one cavity 25 on the surface of the chip base 4, but note that more than one cavity can be formed to change/determine pneumatic impedance of the flow channel 7. In addition, this cavity 25 may also be omitted, as the flow channel can be built in the chip cap or can also include cavities in the device-wafer. The subject of pneumatic impedance within flow channels is addressed in many publications in the prior art, such as:

a. Tas, N. R. and Lammerink, T. S. J. and Leussink, P. J. and Berenschot, J. W. and Bree de, H. E. and Elwensspoek, M. C., "Toward thermal flow-sensing with pL/s resolution," Proc. SPIE, Vol. 4176, 106 (2000).

b. A. Rasmussen, C. Mavriplis, M. E. Zaghloul, O. Mikulchenko and K. Mayaram, "Simulation and optimization of a microfluidic flow sensor," Sensors and Actuators A: Physical, Volume 88, Issue 2, 15 Feb. 2001, Pages 121-132.

c. U.S. Pat. No. 6,263,741 B1 (Woias).

Flow access to the flow channel 7 is realized through two passage-openings 8 and 9. In FIGS. 2a, 2b, and 2c, one passage-opening 8 is formed in the chip base 4 and provides access to the flow channel 7 from the bottom of the semiconductor chip 12. In the embodiment illustrated in FIG. 2a, a second passage-opening 9 is formed in the chip cap 6 to provide access to the flow channel 7 from the top side of the semiconductor chip 12. In another embodiment, the second passage-opening 9 is formed in the chip base 4 to provide access to the flow channel 7 from the bottom of the flow sensor chip 12, as illustrated in FIG. 2b. In yet another embodiment, the second passage-opening 9 is formed between the chip base 4 and the chip cap 6 by allowing a space at one end of the two, as illustrated in FIG. 2c.

Figure 2D:
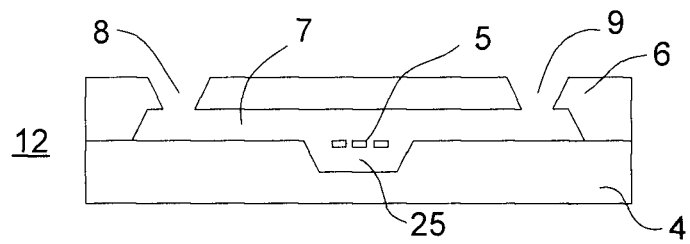
FIG. 2d shows a schematic cross-sectional view of the semiconductor chip with an integrated flow channel, with both passage-openings on the chip cap, in accordance with one embodiment.
Figure 2E:
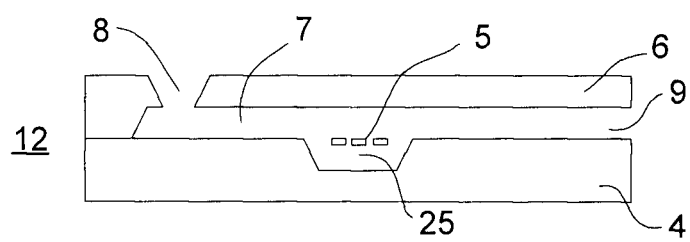
FIG. 2e shows a schematic cross-sectional view of the semiconductor chip with an integrated flow channel, with a passage-opening in the chip cap and a passage opening between the chip cap and the chip base, in accordance with one embodiment.

FIG. 2d shows an alternative embodiment of the semiconductor chip having a flow channel integrated therein, where the two passage-openings are both in the chip cap.

Figure 3A:
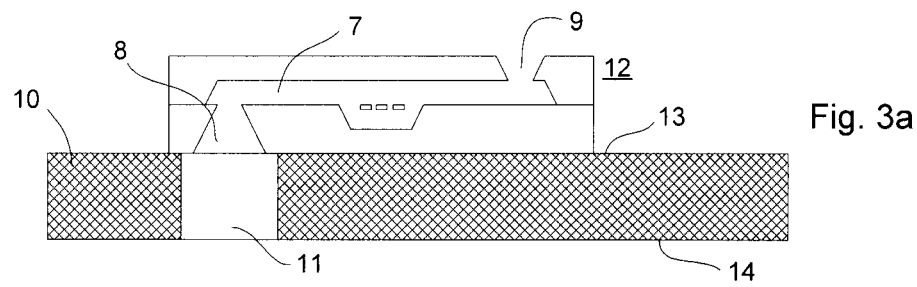
FIG. 3a shows the semiconductor chip from FIG. 2a attached to a package base having an aperture aligned with a passage-opening from the chip base, in accordance with one embodiment.
Figure 3B:
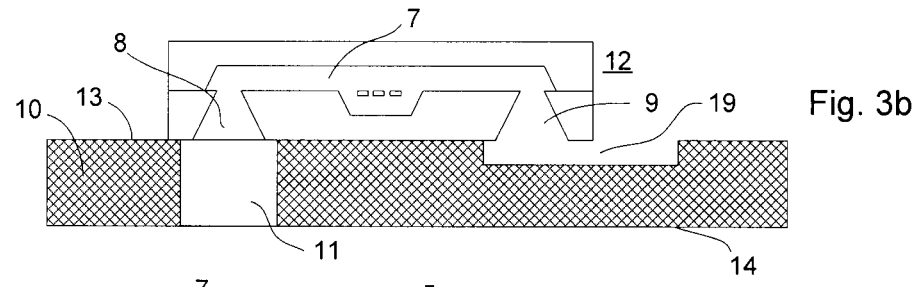
FIG. 3b shows the semiconductor chip from FIG. 2b attached to a different package base allowing fluid communication to both flow passage-openings on the backside of the chip, in accordance with one embodiment.

In the embodiments shown in FIGS. 3a and 3b, the semiconductor chip 12 is attached to a package base 10. The package base 10 has aperture 11 which allows fluid communication between the second surface 14 of the base 10 and the first surface 13 of the base. The passage-opening 8 is aligned to be in fluid communication with the aperture 11. FIG. 3a shows one possible embodiment where the semiconductor chip 12, with the passage-opening 9 realized on the top of the cap, is attached to the package base 10. The semiconductor chip 12, with the passage-opening 9 providing access to the flow channel 7 from the bottom of the chip, can be attached to the package base 10 as shown in FIG. 3b. A recess or notch 19 in the first surface 13 of the package base 10 provides an air gap between the opening of the passage-opening 9 and surface 13 of the package base 10.

In both of the embodiments presented in FIGS. 3a and 3b, one access to the flow channel 7 is realized from the second surface 14 of the package base 10 and a second access to the flow channel 7 is realized from the opposite surface of the combination of the chip and the package-base. The flow sensor chip 12 shown in FIG. 2c can also be attached to the package base 10 as shown in FIG. 3a.

Figure 3C:
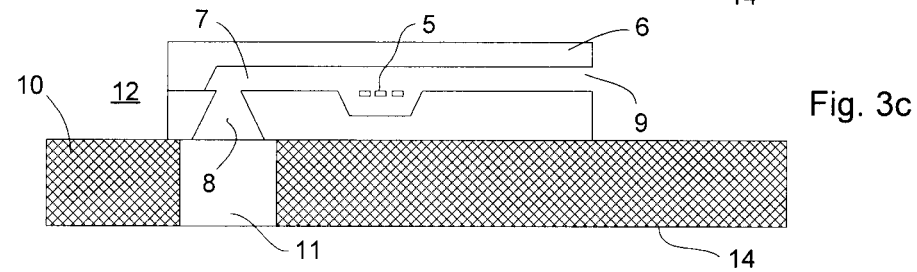
FIG. 3c shows the semiconductor chip from FIG. 2c attached to a package base, in accordance with one embodiment.

Note that in the embodiments shown in FIGS. 3a, 3b, 3c, electrical connections may be made by wirebonding from wirebond pads on the upper surface of the package base to wirebond pads positioned on one of the upper surfaces of the chip base or the chip cap. While typically wirebond pads would be positioned on the upper surface of the chip base, accessible through other openings in the chip cap, there may also be electrical connections made through the body of the chip cap to the upper surface of the chip cap, allowing wirebond pads to be located there.

Figure 3D:
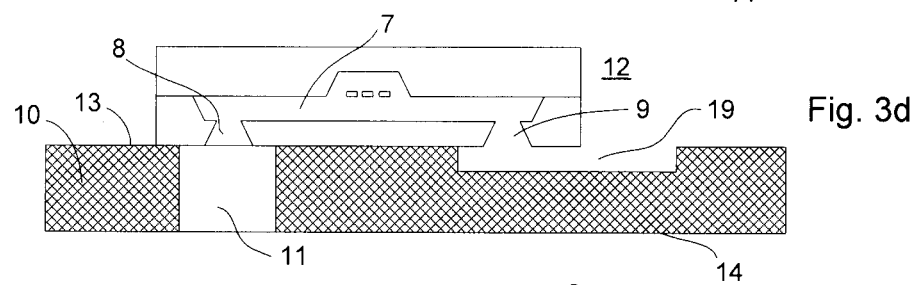
FIG. 3d shows the semiconductor chip from FIG. 2d attached to a package base by the chip cap, in accordance with one embodiment.

FIG. 3d illustrates the semiconductor chip of FIG. 2d positioned upside-down on the package base, wherein one of the passage-openings is in fluid communication with the aperture extending through the package base, and wherein the other of the passage-openings is in fluid communication with a notch on the top side of the package base. The package base is the same type of package base as shown in FIG. 3b, including the notch as described above regarding FIG. 3b. In this case, electrical connections may be made from the package base to the semiconductor chip via electrical connections stemming from the bottom side of the chip base, or via electrical connections on the bottom side of the chip cap (a "flip-chip" type of scheme), or via wirebonds to electrical bondpads on the bottom side of the chip base (which are now seen as being on top in FIG. 3d), or by other available means of electrical connection.

Figure 3E:
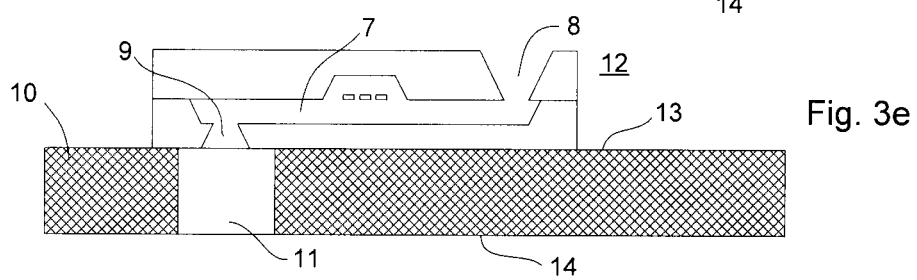
FIG. 3e shows the semiconductor chip from FIG. 2a flipped over and attached to a package base by the chip cap, in accordance with one embodiment.
Figure 3F:
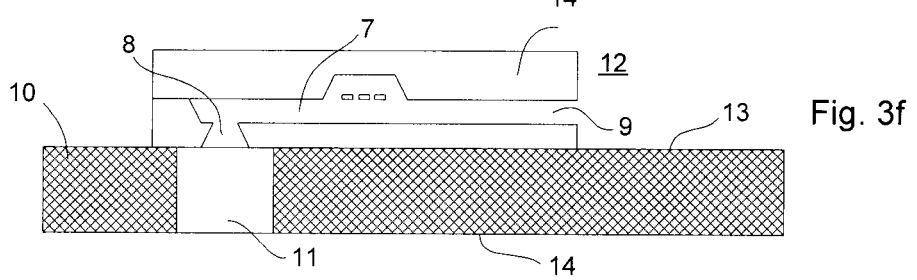
FIG. 3f shows the semiconductor chip from FIG. 2e flipped over and attached to a package base by the chip cap, in accordance with one embodiment.

FIG. 3e shows an alternative embodiment of the semiconductor chip with package base. In this embodiment, the semiconductor chip described in FIG. 2a is upside-down on the package-base, such that the roles of the two passage openings are reversed. The chip cap passage opening 9 is in fluid communication with the aperture in the package base, while the passage opening in the chip base is now facing upward in the same direction as the upper surface of package base. In this case, electrical connections may be made between any available surface of the chip cap or chip base which faces downward toward the upper surface of the package base, by flip-chip electrical connection techniques, including solder balls. These electrical connections may connect directly to the chip base through openings in the chip cap made for that purpose, or may connect to the chip base via through-holes made through the chip cap.

Figure 4A:
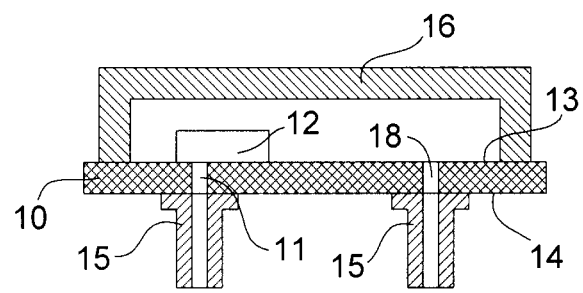
FIG. 4a shows the packaged flow sensing device with two apertures in the package base and flow ports attached thereto, in accordance with one embodiment.
Figure 4B:
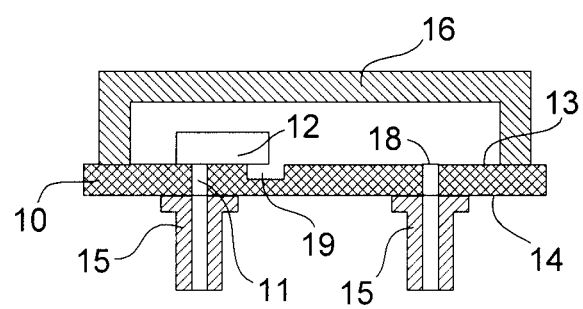
FIG. 4b shows the packaged flow sensing device with a recess in the package base to communicate with a second passage-opening in the chip base, in accordance with one embodiment.
Figure 4C:
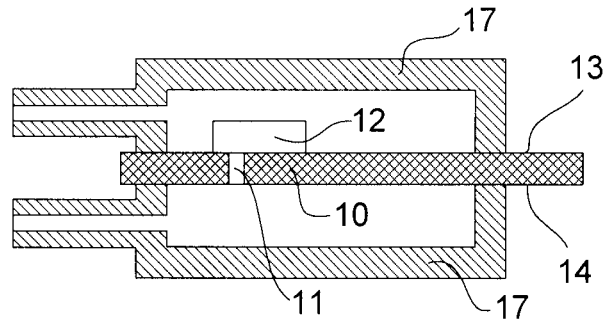
FIG. 4c shows the packaged flow sensing device with two packaging covers, in accordance with one embodiment.
Figure 4D:
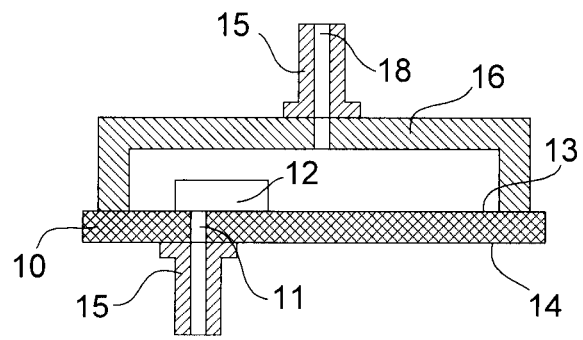
FIG. 4d shows the packaged flow sensing device with an aperture in the package base and a flow port attached thereto, and an aperture in a top packaging cover with a flow port attached thereto, in accordance with one embodiment.

FIGS. 4a to 4d show cross sections of packaged flow sensing devices. In the embodiment of FIG. 4a, the package base 10 has a second aperture 18. Two pressure/flow ports 15 are attached to the surface 14 in fluid communication with the apertures 11 and 18. The packaging cover 16 is attached to the first surface 13 and covers the semiconductor chip 12 and second aperture 18 by forming a cavity with the package-base 10. FIG. 4b illustrates an embodiment where the package base 10 has a notch, as illustrated in FIG. 3b, and the ports 15 are both provided on the bottom surface 14 of the package base 10. In the embodiment shown in FIG. 4c, two packaging covers 17 are attached to opposite surfaces 13 and of the package base 10, and the pressure/flow ports 15 extend from the covers 17. These ports 15 could be positioned anywhere on the surface of the covers 17. In the embodiment of FIG. 4d, the package base 10 has an aperture 11 and a flow port 15 attached thereto. The packaging cover 16 has an aperture 18 and a flow port 15 attached thereto.

The above-described embodiments of the flow sensing device use the semiconductor chip 12 having an integrated flow channel 7. The specially designed flow channel 7 with two passage-openings 8 and 9 has a high pneumatic impedance.

A simple and cost-effective packaging process is provided by usage of the semiconductor chip 12 having an integrated flow channel 7, design of the passage-openings 8, 9 in fluid connection with the flow channel 7, and mounting of the flow sensor chip 12 on the package base 10. In one embodiment, flow channel 7 can be formed with the use of wafer-to-wafer bonding techniques or by surface micromachining technology directly on the surface of the silicon chip. With this approach, multiple flow channels are manufactured in one process at the level of wafer processing, before silicon wafer dicing and packaging. There is no need for forming the individual flow channels during individual packaging of single semiconductor chips, which simplifies shapes of the package parts and eliminates stringent requirements for alignment accuracy. The dimensions and alignment of flow channel 7 fabricated with the use of wafer-to-wafer bonding techniques or surface micromachining technology can be controlled with high accuracy, such as in the range of a few micrometers.

The choice of cross section of the flow channel 7 and its length can lead to an increase in pneumatic impedance of the flow sensor. Micro-flow channels have heights varying in the range from micrometers to tens of micrometers, and widths varying in the range from micrometers to hundreds of micrometers. With these small dimensions, fabrication of flow channels with pneumatic impedance higher than 10 kPa/(ml/s) is possible on a chip with an area of a few square millimeters or less. The flow channels may have rectangular, triangular, trapezoidal, semi-circular or other shapes of cross section depending on the technology used for its fabrication.

It will be understood that numerous modifications of the described embodiments will appear to those skilled in the art. Accordingly, the above description should be taken as illustrative and not in a limiting sense. Possible modifications of the sensor may include, for example, packages with different shapes of the covers with pressure ports having various orientations or one-port packages applicable for unidirectional measurements. Integrated flow channel fabrication methods may include silicon-to-silicon or silicon-to-glass wafer bonding techniques. Surface micromachining methods of fabrication of the flow channel may use polymers of photosensitive polymers like SU-8. The scope of the invention is therefore intended to be limited solely by the scope of the appended claims.

We claim:

1. A flow sensing device comprising:
a semiconductor chip having a chip cap and a chip base and a flow channel integrated therein, the flow channel formed between the chip base and the chip cap, and a sensing element positioned in said flow channel, the semiconductor chip having a first passage-opening in said chip base in fluid communication with said flow channel, and a second passage-opening in one of said chip base, said chip cap, and a space between said chip base and said chip cap in fluid communication with said flow channel; and
a package base, having a top surface on a top side and a bottom surface on a bottom side, attached to said chip base of said semiconductor chip at said top surface, said package base having a first aperture in fluid communication with said first passage-opening, said first aperture extending through said package base from said top surface to said bottom surface, said first passage-opening being accessible from said bottom side of said package base and said second passage-opening of said semiconductor chip being accessible from said top side of said package base.

2. The flow sensor device of claim 1, wherein the second passage-opening of said semiconductor chip is in said chip base, and wherein said package base has a notch on said top side to allow access to said second passage-opening from said top side.

3. The flow sensor device of claim 1, wherein the package base has a second aperture extending therethrough from said top surface to said bottom surface in fluid communication with said second passage-opening.

4. The flow sensing device of claim 1, further comprising a first packaging cover attached to said package base at said top surface and forming a cavity therewith for housing said semiconductor chip, said first packaging cover having a second aperture, said second passage-opening being in fluid communication with said second aperture via said cavity.

5. The flow sensing device of claim 4, further comprising a first flow port attached to first packaging cover and in fluid communication with said second aperture.

6. The flow sensing device of claim 4, further comprising a first flow port extending integrally from said first packaging cover and in fluid communication with said second aperture.

7. The flow sensing device of claim 3, further comprising a first packaging cover attached to said package base at said top surface and forming a cavity therewith for housing said semiconductor chip.

8. The flow sensing device of claim 7, further comprising a second flow port attached to said package base and in fluid communication with said second aperture.

9. The flow sensing device of claim 7, further comprising a second flow port integrally extending from said package base and in fluid communication with said second aperture.

10. The flow sensing device of claim 4, further comprising a second packaging cover attached to said bottom surface of said package base, said second packaging cover having a third aperture in fluid communication with said first aperture.

11. The flow sensing device of claim 10, further comprising a second flow port attached to said second packaging cover and in fluid communication with said third aperture.

12. The flow sensing device of claim 10, further comprising a second flow port integrally extending from said second packaging cover and in fluid communication with said third aperture.

13. The flow sensing device of claim 1, further comprising a first flow port attached to said bottom surface of said package base and in fluid communication with the first aperture.

14. The flow sensing device of claim 1, further comprising a first flow port integrally extending from the bottom surface of said package base and in fluid communication with said first aperture.

15. The flow sensing device of claim 1, wherein said second passage-opening is in said chip cap.

16. The flow sensing device of claim 1, wherein said chip cap is wafer-scale processed.

17. A flow sensing device comprising:
a semiconductor chip having a chip base and a chip cap and a flow channel integrated therein, the flow channel formed between the chip base and the chip cap of said semiconductor chip, and a sensing element positioned in said flow channel, the semiconductor chip having a first passage-opening in said chip cap in fluid communication with said flow channel, and a second passage-opening in one of said chip cap and a space between said chip base and said chip cap in fluid communication with said flow channel;

a package base, having a top surface on a top side and a bottom surface on a bottom side, attached to said chip cap of said semiconductor chip at said top surface, said package base having a first aperture in fluid communication with said first passage-opening, said first aperture extending through said package base from said top surface to said bottom surface, said first passage-opening being accessible from said bottom side of said package base and said second passage-opening of said semiconductor chip being accessible from said top side of said package base.

18. The flow sensor device of claim 17, wherein the second passage-opening of said semiconductor chip is in said chip cap, and wherein said package base has a notch on said top side to allow access to said second passage-opening from said top side.

19. The flow sensor device of claim 17, wherein the package base has a second aperture extending therethrough from said top surface to said bottom surface in fluid communication with said second passage-opening.

20. The flow sensor device of claim 19, further comprising a first packaging cover attached to said package base at said top surface and forming a cavity therewith.

21. The flow sensing device of claim 17, wherein said second passage-opening of said semiconductor chip is in said space between said chip cap and said chip base, and further comprising a first packaging cover attached to said package base at said top surface and forming a cavity therewith for housing said semiconductor chip, said first packaging cover having a second aperture, said second passage-opening being in fluid communication with said second aperture via said cavity.

22. The flow sensing device of claim 17, further comprising a second packaging cover attached to said bottom surface of said package base, said second packaging cover having a third aperture in fluid communication with said first aperture.

\* \* \* \* \*